United States Patent
Aoyama

(10) Patent No.: US 8,198,015 B2
(45) Date of Patent: Jun. 12, 2012

(54) METHOD OF FORMING MASK PATTERN

(75) Inventor: Ryoichi Aoyama, Tokyo (JP)

(73) Assignee: Lapis Semiconductor Co., Ltd. (JP)

( * ) Notice: Subject to any disclaimer, the term of this patent is extended or adjusted under 35 U.S.C. 154(b) by 521 days.

(21) Appl. No.: 12/382,345

(22) Filed: Mar. 13, 2009

(65) Prior Publication Data

US 2009/0246708 A1 Oct. 1, 2009

(30) Foreign Application Priority Data

Mar. 26, 2008 (JP) ................. 2008-080506

(51) Int. Cl.
*G03F 7/20* (2006.01)
(52) U.S. Cl. .......................................... 430/311; 430/30
(58) Field of Classification Search .................. 430/322, 430/311, 395, 30
See application file for complete search history.

(56) References Cited

U.S. PATENT DOCUMENTS

| 5,437,961 A * | 8/1995 | Yano et al. ..................... 430/316 |
| 2005/0208430 A1 * | 9/2005 | Colburn et al. ................ 430/313 |
| 2006/0065910 A1 * | 3/2006 | Ring et al. ..................... 257/192 |

FOREIGN PATENT DOCUMENTS

JP 2002-203785 7/2002

* cited by examiner

*Primary Examiner* — Kathleen Duda
*Assistant Examiner* — Caleen Sullivan
(74) *Attorney, Agent, or Firm* — Rabin & Berdo, PC

(57) ABSTRACT

A mask pattern forming method which can form desired resist patterns accurately and stably on a substrate material like SiC having transparency to light. The method comprising forming a light reflective film on a semiconductor substrate having transparency to light; forming a photo-resist on the light reflective film; projecting exposure light through a master mask onto a focal position adjusted based on light reflected by the light reflective film when projecting focus detecting light onto the semiconductor substrate, thereby exposing the photo-resist; and removing exposed portions or portions other than the exposed portions of the photo-resist so as to pattern the photo-resist.

20 Claims, 3 Drawing Sheets

EXPOSURE LIGHT

ION INJECTION

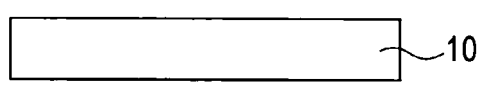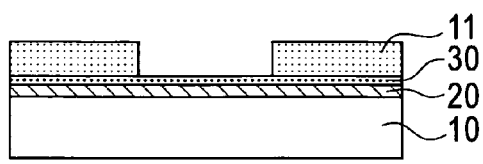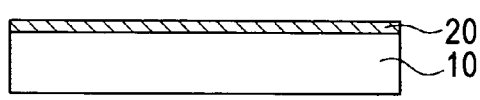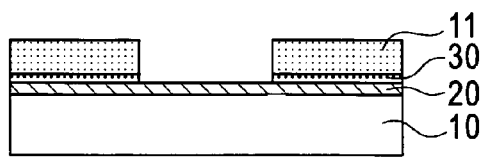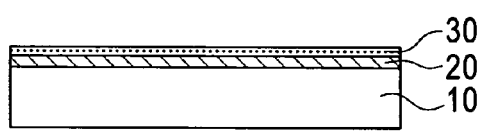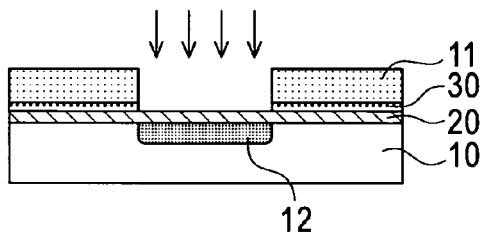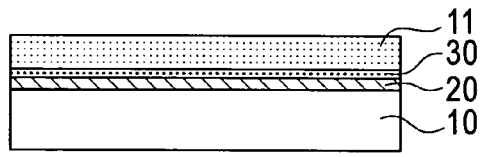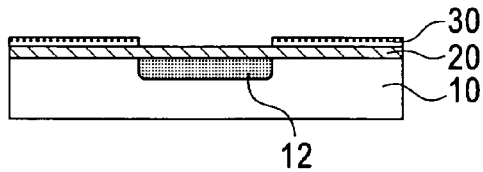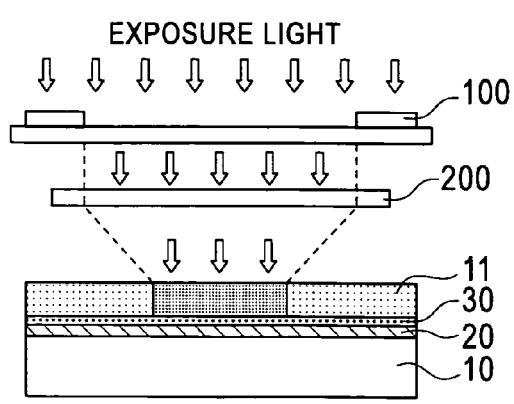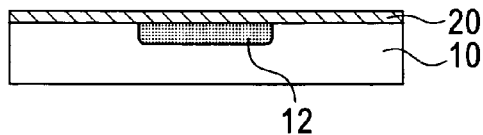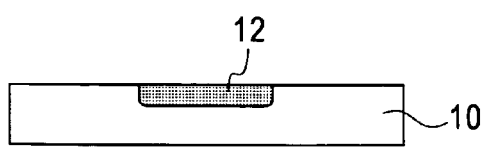

EXPOSURE LIGHT

METHOD OF FORMING MASK PATTERN

BACKGROUND OF THE INVENTION

1. Field of the Invention

The present invention relates to semiconductor device manufacturing technology and particularly to photolithography technology for forming photo resist patterns on semiconductor substrates.

2. Description of the Related Art

Photolithography technology used in the semiconductor device manufacturing process to process films of various materials in shape is well known. A photolithography process comprises process steps similar to those of usual photography. That is, by going through a resist applying step of applying a photo-resist of photosensitive resin on wafers, an exposure step of projecting exposure light through a mask having a planar pattern formed thereon onto a material layer to transfer the pattern of the mask to the photo-resist, and a developing step of forming a transferred resist pattern by photochemical reaction, the resist pattern is formed on the wafers. Using the resist pattern formed in this way as a mask, subsequent etching of a subject layer, ion injection, or the like is performed.

FIGS. 1A to 1F show an example of process steps of a well-area forming process including the conventional photolithography process. The well-area refers to a well-like impurity injected area formed along the surface of a semiconductor substrate to form transistors or the like on the substrate. First, a semiconductor substrate 10 is washed and dried (FIG. 1A). Then, a photo-resist of photosensitive resin is applied uniformly on the semiconductor substrate by, e.g., a spin coat method. Thereafter, heat treatment called prebake is performed (FIG. 1B). Then, the wafer coated with the photo-resist is set in an exposure apparatus, and by projecting exposure light such as ultraviolet through a mask 100, the pattern of the mask is transferred to the photo-resist (FIG. 1C). After overheat treatment called post-exposure bake for promoting chemical reaction in the resist film is performed on the exposed wafer, a strong alkaline developer is sprayed to remove the exposed portions of the photo-resist. After the development, the wafer is washed with dedicated rinse, pure water, or the like, and drying treatment called postbake is performed thereon (FIG. 1D). Next, using the resist pattern formed on the wafer as a mask, impurity ions are injected into the semiconductor substrate 10 to form a well area 12 (FIG. 1E). Subsequently, the photo-resist left on the wafer is removed by ozone ashing, and thereafter a sulfuric acid wash is performed. Going through the above steps, the well-area forming process finishes (FIG. 1F).

In the exposure process step of FIG. 1C, before each exposure by the exposure apparatus, the position in the thickness direction of the semiconductor substrate is measured by a focusing detection system of the exposure apparatus, and through feedback control using the measurement, the stage on which the wafer is mounted is positioned in the substrate-thickness direction to perform exposure. When the position in the thickness direction of the semiconductor substrate is correctly detected and correct feedback control is executed in positioning the wafer stage, a resist pattern having a desired shape and dimensions can be obtained. By the way, in detecting the position in the thickness direction of a semiconductor substrate, focus detecting light such as halogen light is generally projected onto the semiconductor substrate obliquely from above, and the position is detected based on reflected light from the semiconductor substrate. Refer to Japanese Patent Kokai No. 2002-203785 (Patent Document 1).

A semiconductor of silicon carbide (SiC) that is a compound of carbon and silicon has a band gap of 3.25 eV, which is three times as wide as that of the Si semiconductor. Hence, its field intensity at which to reach breakdown is 3 MV/cm and about ten times as high as that of the Si semiconductor. Further, the SiC semiconductor is characterized in that it is high in saturated drift velocity, is excellent in thermal conductivity, heat resistance, and chemical resistance, and is higher in the resistance to radiation than the Si semiconductor. These characteristics enable the production of power devices and high-frequency devices which are much smaller, lower in loss, and more efficient than ones made of the Si semiconductor and of semiconductor devices excellent in radiation resistance. Accordingly, there are large needs for SiC devices in astronautic and nuclear fields as well as electric power, transport, electric appliance fields. Recently, the study of their use as semiconductor devices for use in hybrid vehicles has gained momentum because the advantage has been attracting attention that their power consumption is small and the upper temperature limit is 400° C. and higher than that of the Si semiconductor, thus not needing a dissipating device such as a cooling fan.

However, because SiC is a transparent material having transparency to light, a problem may occur in the process of forming a photo-resist pattern on a SiC substrate. Namely, if substrate material is transparent or semitransparent like SiC, focus detecting light projected by the exposure apparatus to detect the position in the thickness direction of a substrate is transmitted into the substrate and reflected inside the substrate or by the bottom of the substrate, and thus the position in the thickness direction of the substrate is detected based on the reflected light. In this case, the focus detecting light is not always reflected by the same plane, which results in lower accuracy in detecting the position in the thickness direction of the substrate. Thus, positioning control of the wafer stage in the substrate-thickness direction, that is, the focus control of exposure light cannot be correctly executed either. Hence, it is difficult to transfer the pattern of a master mask to a resist with fidelity, and there is a possibility that a resist pattern of a desired shape and dimensions cannot be formed.

Even where the position of a substrate is not correctly detected by the exposure apparatus, for example, if the focus detecting light were always reflected by the same plane throughout a wafer, a desired resist pattern could be formed by setting an offset in the exposure apparatus. However, because the position in the thickness direction of a substrate detected by the exposure apparatus is subject to variation in the refractive indexes of the substrate and the resist, the above method that sets an offset cannot solve this problem with substrates like SiC substrates having many defects therein, namely, having a refractive index varying locally. Thus, if the conventional photolithography process is applied as it is to form a resist pattern on a transparent or semitransparent substrate like a SiC substrate, the focusing of exposure light will be uneven for each exposure, resulting in variation in the shape and dimensions of the finished resist pattern within the same wafer surface and the same lot, and among lots. In a worst-case scenario, the resist pattern itself may not be formed due to an inappropriate exposure process.

SUMMARY OF THE INVENTION

The present invention has been made in view of the above situation, and an object thereof is to provide a mask pattern forming method that can accurately, stably form a desired resist pattern on substrate material like SiC having transparency to light.

According to the present invention, there is provided a method of forming a mask pattern, comprising forming a light reflective film on a semiconductor substrate; forming a photo-resist on the light reflective film; projecting exposure light through a mask onto a focal position adjusted based on light reflected by the light reflective film when projecting focus detecting light onto the semiconductor substrate, thereby selectively exposing the photo-resist; and removing selectively exposed portions or non-exposed portions of the photo-resist so as to pattern the photo-resist to be the mask pattern.

BRIEF EXPLANATION OF THE DRAWINGS

FIGS. 2A to 2K show process steps of a well-area forming process as an embodiment of the application of a resist pattern forming method of the present invention.

DETAILED DESCRIPTION OF THE PREFERRED EMBODIMENT

Figure 1A:
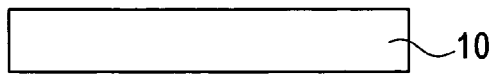
FIGS. 1A to 1F show process steps of a well-area forming process to which a conventional resist pattern forming method is applied.
Figure 1B:
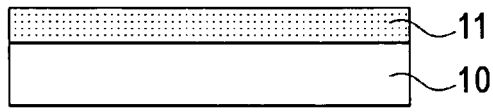
Figure 1C:
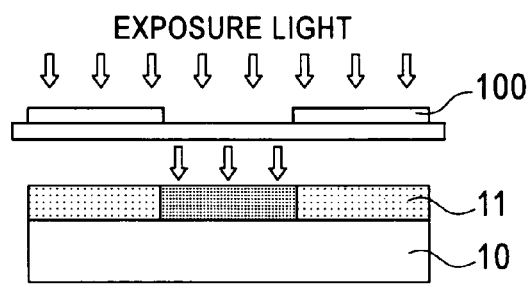
Figure 1D:
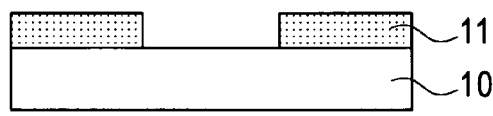
Figure 1E:
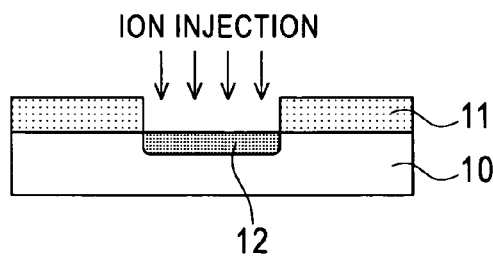
Figure 1F:
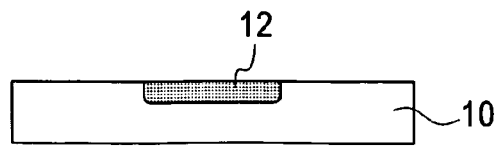

Embodiments of the present invention will be described below with reference to the accompanying drawings. The same reference numerals will be used in the figures described below to denote substantially the same or equivalent elements or parts. FIGS. 2A to 2K show process steps of the well-area forming process for semiconductor devices to which a photo-resist pattern forming method of the present invention is applied. First, a SiC substrate 10 is prepared. The SiC substrate 10 is an n-type 4H-SiC substrate of about 300 μm in thickness which is doped with, e.g., nitrogen (N) and has transparency to light. The SiC substrate 10 is supplied in the form of a wafer. Then, an initial wash is performed on the SiC substrate 10 using, e.g., sulfuric acid/hydrogen peroxide mixture (SPM) and hydrogen fluoride (HF). Thereafter, the wash liquid is washed off with ultrapure water and drying is performed by, e.g., a spin dry method (FIG. 2A).

Next, an $SiO_2$ film 20 is deposited to be, e.g., about 300 nm thick over the SiC substrate 10 by a plasma CVD method using silane ($SiH_4$) and oxygen ($O_2$) as material gases (FIG. 2B). This $SiO_2$ film works as a surface protection layer to alleviate damage to the surface of the SiC substrate 10 in a later ion injection step.

Then, a flat tungsten silicide ($WSi_2$) film 30 is deposited to be, e.g., about 20 nm thick over the $SiO_2$ film 20 by a sputtering method (FIG. 2C). The sputtering method is a method where argon ions collide with a target in a high vacuum, thereby ejecting atoms forming part of the target by a sputtering phenomenon so that the target atoms are deposited on a wafer facing it. The $WSi_2$ film 30 formed in this way has reflectivity to light and works as a light reflective film of the present invention.

Then, a photo-resist 11 of photosensitive resin is applied over the $WSi_2$ film 30 (FIG. 2D). The photo-resist 11 functions as a mask in the later ion injection and is formed to be, e.g., about 2 μm thick. In applying the photo-resist 11 over the substrate, a coater is used. The wafer is vacuum chucked on a rotating stage of the coater, and after a resist solution is dropped from a nozzle onto the wafer, the rotating stage with the wafer mounted thereon is rotated at high speed to apply the photo-resist of uniform thickness. The thickness of the photo-resist is adjusted by resist viscosity, the rotation speed of the coater, time, etc. Photo-resists are mainly classified into two types: a positive type of resist whose portions irradiated with exposure light are removed by subsequent development and a negative type of resist whose portions irradiated with exposure light are left through subsequent development. The photo-resist pattern forming method of the present invention can be applied to either type. In this embodiment, the positive type is used. After the photo-resist 11 is applied, heat treatment called prebake is performed.

Then, the wafer having the photo-resist 11 formed thereon is set on the stage of a stepper (a reducing projection exposure apparatus), and the pattern on a master mask (reticle) made four to ten times the size of an actual mask pattern is reduction-projected by exposure through a reducing projection lens 200 onto the photo-resist 11 (FIG. 2E). For example, a krypton fluoride (KrF) excimer laser can be used as a light source for exposure light. Before projecting exposure light, as described above, the position in the thickness direction of the substrate is detected by a focusing detection system of the exposure apparatus, and through feedback control, the stage on which the substrate is mounted is positioned in the substrate-thickness direction, thereby adjusting the focal position of exposure light. Here, focus detecting light for the position detection of the substrate is irradiated onto the substrate obliquely from above. The focus detecting light passes through the photo-resist 11 and is reflected by the surface of the $WSi_2$ film 30, and the position in the thickness direction of the substrate is detected based on the reflected light. Because the $WSi_2$ film 30 remains flat and extends in the same plane, the focus detecting light is always reflected by the same plane throughout the wafer. Because the focus control of exposure light is performed based on this reflected light, the focus control of exposure light can be correctly, stably executed even for SiC substrates having transparency to light. As a result, the problem of variation in the shape and dimensions of the finished resist pattern within the same wafer surface and the same lot, and among lots is solved, and resist patterns of desired shape and dimensions can be formed highly accurately and stably. The stepper repeats in X- and Y-directions a step-and-repeat operation of moving the stage by one step to perform the next shot of exposure each time one shot of exposure finishes, thereby carrying out the exposure process on the entire wafer. For each step, the above position detection of the substrate and the focus control is performed.

After the completion of the exposure of the photo-resist 11, post-exposure bake treatment is performed. Subsequently, a strong alkaline developer is sprayed to remove the exposed portions of the photo-resist. After the development, the wafer is washed with dedicated rinse, pure water, or the like, and drying treatment is performed through postbake treatment (FIG. 2F).

Next, dry etching using a mixed gas of hydrogen bromide (HBr) and sulfur hexafluoride ($SF_6$) is performed to remove the exposed portions of the $WSi_2$ film 30 through the openings of the photo-resist 11 (FIG. 2G). In this dry etching, the wafer is put in the vacuumed chamber of a dry etching apparatus, and the above etching gas is introduced into the chamber, and the upper electrode is grounded with a high-frequency voltage being applied to the wafer holder holding the wafer opposite this electrode, thereby generating plasma. By this means, the exposed portions of the $WSi_2$ film 30 are etched through the openings of the photo-resist 11 by means of the collision of ions accelerated by the electric field and chemical reactions with excited ions and radicals.

Then, by injecting, e.g., boron (B) ions via the $SiO_2$ film 20, p-type well areas 12 that are defined by the portions of the substrate surface exposed through the openings of the photo-resist 11 are formed (FIG. 2H). The ion injection is performed by introducing boron gas into the chamber of an ion injecting apparatus and with ionizing it by discharge, accelerating ions by the electric field, thereby injecting them into the substrate. The injection depth of the impurity is controlled via injection energy, and the amount of the impurity added is controlled via the ion beam current and irradiation time. The $SiO_2$ film 20 works as a surface protection film to reduce damage to the SiC substrate 10 in this ion injection.

Then, in the ashing process step, the photo-resist 11 left on the surface of the substrate is removed by ozone ($O_3$) or $O_2$ plasma irradiation. Thereafter, sulfuric acid wash is performed to dispose of residues of the photo-resist (FIG. 2I).

Next, dry etching using a mixed gas of hydrogen bromide (HBr) and sulfur hexafluoride ($SF_6$) is performed on the entire surface of the substrate to completely remove the portions of the $WSi_2$ film 30 that were covered with the photo-resist 11 (FIG. 2J).

Then, by washing the substrate using sulfuric acid/hydrogen peroxide mixture (SPM) and hydrogen fluoride (HF), the $SiO_2$ film 20 formed as a surface protection film on the substrate surface is removed (FIG. 2K).

Going through the above process steps, the well-area forming process is completed. As such, according to the photo-resist pattern forming method of the present invention, there is a light reflective film formed underneath the photo-resist, and hence where processing is performed on a transparent or semitransparent substrate material such as SiC with use of a photo-mask, the position in the thickness direction of the substrate can be detected correctly and stably for the exposure of the photo-resist, and the correct focus control of exposure light can be executed. As a result, resist patterns of desired shape and dimensions can be formed, and the problem of variation in the shape and dimensions of the finished resist pattern within the same wafer surface and the same lot, and among lots is solved, and thus the present invention can contribute to stabilizing the quality of semiconductor devices. Because the $WSi_2$ film formed on the substrate surface for detecting the position of the substrate is completely removed in a subsequent step, it has no effect on the devices. Moreover, it is expected that with the photo-resist pattern forming method of the present invention, chip leveling in the exposure process step can also be executed correctly. The chip leveling refers to position control to make a wafer parallel to an image plane formed by the projection lens of an exposure apparatus, which is performed based on reflected light of halogen light irradiated onto the substrate as in the focus control.

Figure 3A:
FIGS. 3A to 3J show process steps of an STI forming process as an embodiment of the application of the resist pattern forming method of the present invention.

FIGS. 3A to 3J show the process steps of an STI (shallow trench isolation) forming process as another embodiment of the application of the photo-resist pattern forming method of the present invention. First, a SiC substrate 10 is prepared. The SiC substrate 10 is an n-type 4H-SiC substrate of about 300 μm in thickness which is doped with, e.g., nitrogen (N) and has transparency to light. Then, an initial wash is performed on the SiC substrate 10 using, e.g., sulfuric acid/hydrogen peroxide mixture (SPM) and hydrogen fluoride (HF). Thereafter, the wash liquid is washed off with ultrapure water or the like and drying is performed by, e.g., the spin dry method (FIG. 3A).

Figure 3B:
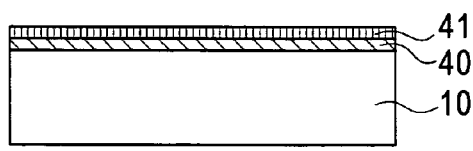

Next, an $SiO_2$ film 40 is grown over the surface of the SiC substrate 10 by a thermal oxidation method, and a silicon nitride film ($Si_3N_4$) 41 is deposited thereon by a CVD method using silane ($SiH_4$) and ammonia ($NH_3$) as material gases (FIG. 3B). This $SiO_2$ film 40 and the silicon nitride film 41 work as a mask in later trench formation and also as a stopper in CMP planarization.

Figure 3C:
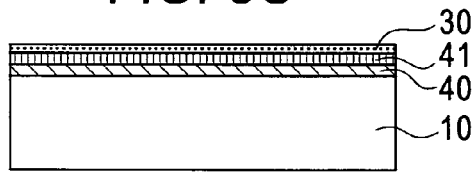

Then, a tungsten silicide ($WSi_2$) film 30 is deposited to be, e.g., about 20 nm thick over the silicon nitride film 41 by the sputtering method (FIG. 3C). The $WSi_2$ film 30 works as a light reflective film for the focus control of exposure light in the exposure process step as in the well-area formation.

Figure 3D:
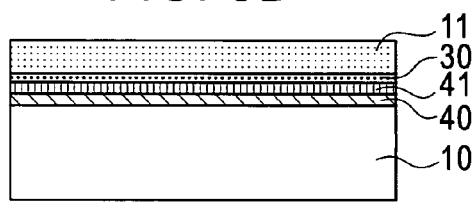

Then, a photo-resist 11 of photosensitive resin is applied over the whole surface of the deposited $WSi_2$ film 30 (FIG. 3D). The application of the photo-resist 11 is performed by the spin coat method. Thereafter, prebake is performed.

Figure 3E:
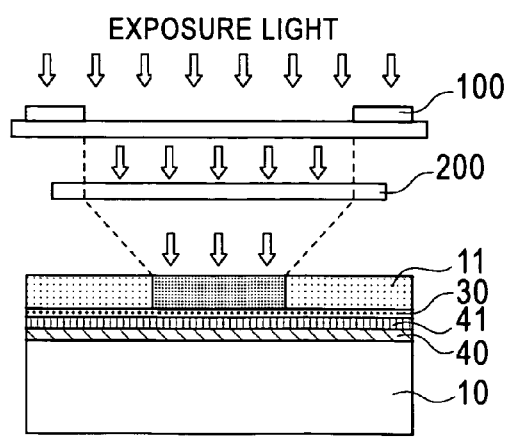

Then, the wafer having the photo-resist 11 formed thereon is set on the stage of the stepper, and the pattern on a master mask (reticle) is reduction-projected by exposure through the reducing projection lens 200 onto the photo-resist 11 (FIG. 3E). For example, a krypton fluoride (KrF) excimer laser can be used as a light source for exposure light. While the focus control of exposure light is performed with detecting the position in the thickness direction of a substrate based on reflected light of the focus detecting light as described above, the focus detecting light is not transmitted into the SiC substrate but reflected by the surface of the $WSi_2$ film 30. Hence, the position detection of the substrate can be accurately executed. As a result, resist patterns of desired shape and dimensions can be formed, and the problem of variation in the shape and dimensions of the finished resist pattern within the same wafer surface and the same lot, and among lots can be solved. The exposure process is performed on the entire wafer surface by the step-and-repeat operation. Post-exposure bake treatment is performed on the substrate after the completion of the exposure of the photo-resist 11, and thereafter a strong alkaline developer is sprayed to remove the exposed portions of the photo-resist. After the development, the substrate is washed with dedicated rinse, pure water, or the like, and drying treatment is performed through postbake treatment.

Figure 3F:
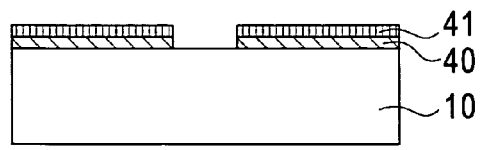

Next, dry etching using a mixed gas of hydrogen bromide (HBr) and sulfur hexafluoride ($SF_6$) is performed to remove the exposed portions of the $WSi_2$ film 30 through the openings of the photo-resist 11. Subsequently, the exposed portions of the silicon nitride film 41 and the $SiO_2$ film 40 through the openings of the photo-resist 11 after the etching of the $WSi_2$ film 30 are removed by dry etching. Thereafter, dry ashing using ozone ($O_3$) or $O_2$ plasma irradiation and a sulfuric acid wash are performed to remove the photo-resist 11. Then, the portions of the $WSi_2$ film 30 covered by the photo-resist are removed by dry etching. A laminated film of the $SiO_2$ film 40 and the silicon nitride film 41 that have been patterned is left on the SiC substrate 10 (FIG. 3F).

Figure 3G:
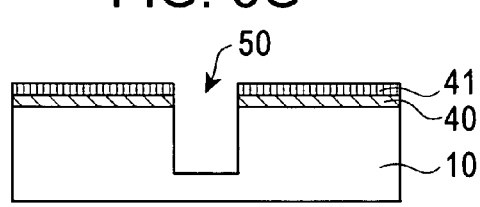
Figure 3H:
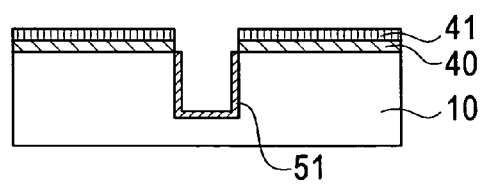

Then, trenches 50 are formed in the SiC substrate 10 by dry etching using the patterned $SiO_2$ film 40 and silicon nitride film 41 as a mask and, e.g., sulfur hexafluoride ($SF_6$) as etching gas (FIG. 3G). Subsequently, a thermal oxide film 51 is formed on the inner wall of the trench 50 by the thermal oxidation method (FIG. 3H).

Figure 3I:
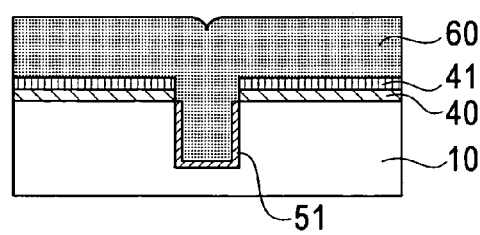

Next, an $SiO_2$ film 60 is deposited on the substrate so as to fill the trench 50 by the CVD method using, e.g., silane ($SiH_4$) and oxygen ($O_2$) as material gases (FIG. 3I).

Figure 3J:
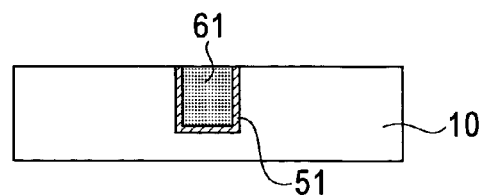

Then, the $SiO_2$ film 60 deposited on the substrate is abraded by a CMP planarization method. In the CMP planarization, the wafer fixed to a spindle is made to contact an abrasive pad stuck on a turn table, and abrasion is performed with making an abrasive solution (slurry) including silica particles flow along the substrate surface. The CMP planarization is performed until the silicon nitride film 41 formed on the substrate gets exposed. Thereafter, the silicon nitride film 41 left on the SiC substrate 10 is removed with hot phosphoric acid ($H_3PO_4$), and the $SiO_2$ film 40 is removed with hydrogen fluoride (HF) Element separation regions 61 are formed in the SiC substrate 10 through the above series of process steps, and the STI forming process finishes (FIG. 3J).

As such, the photo-resist pattern forming method of the present invention can be applied to the STI forming process as well. As in the well-area forming process, because of providing the WSi$_2$ film 30 underneath the photo-resist, the position in the thickness direction of the substrate can be detected correctly and stably by the exposure apparatus, and hence the focus control of exposure light can be correctly executed, and resist patterns of desired shape and dimensions can be formed. As a result, the problem of variation in the shape and dimensions of the finished resist pattern within the same wafer surface and the same lot, and among lots is solved, and thus the present invention can contribute to stabilizing the quality of semiconductor devices.

The photo-resist pattern forming method of the present invention can be applied to other processes containing the photolithography process than the above embodiments. For example, in the process of forming a field oxide film on a SiC substrate by a LOCOS (Local Oxidation of Silicon) method, the method of the present invention can be applied to the formation of a resist pattern for patterning a silicon nitride film used as a mask for local oxidation. Further, in a gate electrode forming process, the method can be applied to the formation of a resist pattern for patterning a poly-silicon film deposited on a substrate to form gate electrodes. Moreover, in the process of forming contact plugs to electrically connect to source/drain regions formed in a SiC substrate, the method can be applied to the formation of a resist pattern for forming contact holes to be filled with contact plugs in an insulating film deposited on a substrate.

In the above embodiments, a tungsten silicide (WSi$_2$) is used as the light reflective film, but other metals such as Al, Ti, TiN, Mo, and W may be used as the material of the light reflective film. Further, the light reflective film may be formed using the CVD method or an evaporation method, not being limited to the sputter method, and its thickness can be changed as needed.

While the present invention produces a remarkable effect when applied to the manufacture process of semiconductor devices using SiC substrates, it can be applied to the manufacture process of semiconductor devices using other substrates such as conventional bulk substrates, and an effect can be expected to be obtained.

This application is based on Japanese Patent Application No. 2008-080506 which is hereby incorporated by reference.

What is claimed is:

1. A method of forming a mask pattern, comprising:
   forming a light reflective film on a semiconductor substrate or an underlying layer formed on said semiconductor substrate;
   forming a photo-resist on said light reflective film;
   projecting exposure light through a mask onto a focal position adjusted based on light reflected by said light reflective film when projecting focus detecting light onto said semiconductor substrate, thereby selectively exposing said photo-resist; and
   removing selectively exposed portions or non-exposed portions of said photo-resist so as to pattern said photo-resist to be said mask pattern.

2. A mask pattern forming method according to claim 1, further comprising:
   forming a protection film between said semiconductor substrate and said light reflective film.

3. A mask pattern forming method according to claim 2, wherein said semiconductor substrate is made of SiC.

4. A mask pattern forming method according to claim 1, wherein said light reflective film is a metal film.

5. A mask pattern forming method according to claim 4, wherein said semiconductor substrate is made of SiC.

6. A mask pattern forming method according to claim 1, wherein said light reflective film is flat.

7. A mask pattern forming method according to claim 6, wherein said semiconductor substrate is made of SiC.

8. A mask pattern forming method according to claim 1, further comprising:
   removing said light reflective film after patterning said photo-resist.

9. A mask pattern forming method according to claim 8, wherein said semiconductor substrate is made of SiC.

10. A mask pattern forming method according to claim 1, wherein said semiconductor substrate has transparency to light.

11. A mask pattern forming method according to claim 10, wherein said semiconductor substrate is made of SiC.

12. A mask pattern forming method according to claim 1, wherein said semiconductor substrate is made of SiC.

13. A mask pattern forming method according to claim 1, wherein in the step of projecting exposure light, the reflected light is detected and used to determine a position of the semiconductor substrate or the underlying layer that the light reflective film is formed on, and the focal position is adjusted based upon the determined position.

14. A method of manufacturing a semiconductor device comprising a mask pattern forming method according to claim 1.

15. A method of manufacturing a semiconductor device comprising a mask pattern forming method according to claim 12.

16. A method of manufacturing a semiconductor device comprising a mask pattern forming method according to claim 3.

17. A method of manufacturing a semiconductor device comprising a mask pattern forming method according to claim 5.

18. A method of manufacturing a semiconductor device comprising a mask pattern forming method according to claim 7.

19. A method of manufacturing a semiconductor device comprising a mask pattern forming method according to claim 9.

20. A method of manufacturing a semiconductor device comprising a mask pattern forming method according to claim 11.

* * * * *